(12) United States Patent
Burr et al.

(10) Patent No.: US 6,175,543 B1
(45) Date of Patent: Jan. 16, 2001

(54) ENCODING TECHNIQUE OF DATA PATTERNS TO IMPROVE SIGNAL-TO-NOISE RATIO DURING CANTENT-ADDRESSABLE RETRIEVAL

(75) Inventors: Geoffrey W. Burr, Cupertino; Hans Coufal, San Jose, both of CA (US); Sebastian Kobras, Munich Bavaria (DE)

(73) Assignee: International Business Machines Corporation, Armonk, NY (US)

( * ) Notice: Under 35 U.S.C. 154(b), the term of this patent shall be extended for 0 days.

(21) Appl. No.: 09/166,164

(22) Filed: Oct. 5, 1998

(51) Int. Cl.$^7$ .................................................. G11B 7/00
(52) U.S. Cl. ............................................................ 369/103
(58) Field of Search ................................ 369/47, 48, 59, 369/103, 112, 100; 365/125

(56) References Cited

U.S. PATENT DOCUMENTS 5,319,629  6/1994  Henshaw et al. .

*Primary Examiner*—Paul W. Huber
(74) *Attorney, Agent, or Firm*—Thomas R. Berthold, Esq.; Banner & Witcoff, Ltd.

(57) ABSTRACT

A content-addressable optical storage system in which a first beam of light is modulated an image to-be-stored and directed to a storage location in an optical storage medium. The image to-be-stored has a plurality of pixels representing at least one field of digital data that are selectively organized along a selected data track as a pattern of ON and OFF pixels representing a data value by a position of a block of pixels of a predetermined size on the data track. A second beam of light, which is coherent with the first beam of light, is modulated with a predetermined modulation pattern and directed to the storage location. The second beam of light passes through the optical storage medium and is focussed at a plurality of localized portions of a correlation plane in the predetermined modulation pattern. The image to-be-stored in the storage medium is recorded at the storage location medium based on an intersection of the first beam and the second beam in the optical storage medium. Optical correlation is provided by blocking the second beam of light, and modulating a third beam of light an image to-be-correlated and that is directed to the optical storage medium. At least one set of reconstructed correlation peaks are detected at the correlation plane matching the modulation pattern of the second beam of light. A brightness of the set of detected reconstructed correlation peaks indicates a similarity between the image to-be-correlated and a stored image.

78 Claims, 3 Drawing Sheets

ENCODING TECHNIQUE OF DATA PATTERNS TO IMPROVE SIGNAL-TO-NOISE RATIO DURING CANTENT-ADDRESSABLE RETRIEVAL

CROSS-REFERENCE TO RELATED APPLICATIONS

The present application is related to U.S. patent application Ser. No.09/166,165, filed concurrently with the present application, and is incorporated by reference herein.

BACKGROUND OF THE INVENTION

1. Field of the Invention

The present invention relates to the field of optical memories. More particularly, the present invention relates to a method and the system for a content-addressable optical data storage system.

2. Description of the Related Art

Both precision and similarity searches are performed in many database applications. A precision search is an identification of all records in a database that exactly match a query argument. Typically, each record has a small number of dimensions, i.e., 5–20, that are defined with high resolution. A precision search is usually based on a combination of a few dimensions, and is desired to be relatively high speed. A similarity search is an identification of all records in a database that are similar to a query argument. For a similarity search, records typically have a large number of dimensions, i.e., 100–1000, that are defined with low resolution. A similarity search is usually based on most or all dimensions, with the degree of similarity as a desired output characteristic. Search speed is not necessarily an issue.

Algorithmic and optical correlation approaches have been developed for performing database searches. Algorithmic approaches exhibit a trade off between flexibility and speed by indexing responses to possible searches. Even though the search time through N records can be made less than O(N) for an algorithmic approach, the entire database must be re-indexed when a single record is added to the database.

Volume holography-based optical correlation has been proposed as a technique for searching for digital data that has been organized into a spatial pattern and then used as a template and query image. See, for example, B. J. Goertzen et al., Error-correcting code for volume holographic storage of a relational database, Optics Letters, 20(15), pp. 1655–1657, 1995. Holographic correlation is well-suited for searching databases that have records composed of fixed-length fields, but not for locating words at arbitrary locations within a page of text. Consequently, no serious demonstration of volume holography-based optical correlation has been shown.

A main focus for volume holography-based optical correlation thus far has been on forming smart-pixel arrays for detecting a patterned data page as readout by a reference beam. See, for example, B. J. Goertzen et al., Volume holographic storage for large relational databases, Optical Engineering, 35(7), pp. 1847–1853, 1995; R. D Snyder et al., Database filter: optoelectronic design and implementation, Applied Optics, 36(20), pp. 4881–4889, 1997; and K. G. Richling et al., Holographic storage and associative processing of analog and digital data, Proceedings of the 1997 IEEE LEOS Annual Meeting, pp. 132–133, 1997.

Optical correlation approaches using volume holography are based on a two-dimensional (2-D) cross-correlation between two images at a hardware level, such as disclosed by B. J. Goertzen et al., Volume holographic storage for large relational databases, Optical Engineering, 35(7), pp. 1847–1853, 1995. Lenses are used for performing a 2-D Fourier transform by implementing a convolution and correlation by Fourier transforming two images, multiplying the images, and then performing a second Fourier transform on the resulting product of the images. A hologram stores the Fourier transform of the first image in space as a multiplicand for the second image, and to shift the output angle of the correlation so that the correlation can be distinguished from the transmission of the second image.

A volume hologram is stored within a photosensitive material by interfering a desired information-carrying light beam, referred to as an object beam, with a reference beam to form a hologram of the desired information. The desired information or records are displayed on a pixellated input device, such as a Spatial Light Modulator (SLM), organized as spatial patterns forming "images" that are modulated onto an input laser beam to form the object beam. The object beam is then directed into a thick photosensitive storage material, such as a photorefractive crystal or a photopolymer. The reference light beam, which is coherent with the object beam, is also directed into the photosensitive storage material so that it interferes with the object beam. Several thousand holograms can be superimposed in the same volume of photosensitive storage material.

After storage, the respective reference beams for all the holograms that are superimposed in the volume of the photosensitive storage material can be reconstructed by illuminating the volume with a new object beam having a selected interrogating spatial pattern. The amount of light diffracted into each respective reference beam is a measure of the cross-correlation between the interrogating spatial pattern and the originally-stored pattern. Many cross-correlations can be output in parallel because as many as several thousand holograms can be superimposed in the same volume of photosensitive storage material.

An exemplary content-addressable optical data storage system is disclosed by U.S. Pat. No. 5,319,629 to Henshaw et al. The Henshaw et al. storage system includes a multi-dimensional optical storage medium that stores a plurality of holographic images representative of data. A search argument having a target data field is coupled into the optical storage medium for extracting a set of address fields at which data fields in the storage medium that match the target data field of the search argument are stored. The storage medium is a spectral hole burning (SHB) material having an address field that includes a wavelength address and a Bragg angle address. The wavelength address specifies a wavelength of light at which a particular data field is stored in the optical medium. The Bragg angle address specifies an angle of incidence of a reference light beam at which a particular data field is stored in the optical medium.

Optical correlation has also been used as a technique for pattern recognition for analog images, such as by detecting targets within a satellite photograph. The number of target templates that a real-time input image can be simultaneously compared against can be increased by multiplexing multiple volume holograms within a thick photosensitive storage material. Performance issues include signal detection within noise and clutter, such as non-target images in a satellite photograph, and image distortions, such as scale or rotation.

What is needed is a way in which many storage volumes can be interrogated simultaneously, thereby increasing the parallelism with which an optical data storage system can be searched. What is also needed is improved detection of optically-performed correlations that is robust in the presence of noise. Further still, what is needed is a way for performing similarity searches on holographically stored digital records.

SUMMARY OF THE INVENTION

The present invention provides two system architectures in which many storage volumes can be interrogated simultaneously, thereby increasing the parallelism with which an optical data storage system can be searched. The present invention also provides improved detection of optically-performed correlations that is robust in the presence of noise. Further still, the present invention provides a technique for performing similarity searches on holographically stored digital records.

The advantages of the present invention are provided by a content-addressable optical storage system in which a first beam of light is modulated with information of an image to-be-stored and directed to a storage location in an optical storage medium. The image to-be-stored has a plurality of pixels representing at least one field of digital data that are selectively organized along a selected data track as a pattern of ON and OFF pixels representing a data value by a position of a block of pixels of a predetermined size on the data track such that data values that are sequential in an ordinal arrangement are located in neighboring positions along the data track. The pattern of ON and OFF pixels can be weighted by an amplitude and/or a phase based on a contribution of the data field to a correlation result. A second beam of light, which is coherent with the first beam of light, is modulated with a predetermined modulation pattern and directed to the storage location. The second beam of light passes through the optical storage medium and is focussed at a plurality of localized portions of a correlation plane in the predetermined modulation pattern. The image to-be-stored in the storage medium is recorded at the storage location based on an intersection of the first beam and the second beam in the optical storage medium.

According to the invention, the first beam of light is modulated by a spatial light modulator that has a plurality of individual modulating elements that are associated into at least two portions of the spatial light modulator. In one configuration of the present invention, a different phase multiplier is modulated onto the portion of the first light beam incident upon elements in each respective portion of the spatial light modulator for minimizing an undesired diffraction caused by non-zero OFF-state modulating elements of the spatial light modulator. In another configuration, a different phase multiplier is modulated onto the portion of the first light beam incident upon elements in each respective portion of the spatial light modulator for minimizing an undesired cross-correlation between an exact match and a nearly exact match of the image to-be-correlated.

The image to-be-stored can be a test image pattern from which a set of bias values is detected from detected correlation peaks, and subsequently-detected correlation peaks are scaled relative to each other based on the set of bias values. The test image pattern can be, for example, an image pattern in which all pixels of the pattern block light. In this case, the set of bias values are subtracted from subsequently-detected correlation peaks.

For optical correlation, the second beam of light is blocked from being directed to the optical storage medium. A third beam of light is modulated with information of an image to-be-correlated and directed to the optical storage medium. The image to-be-correlated has a plurality of pixels representing at least one field that are selectively organized along a selected data track as a pattern of ON and OFF pixels representing a data value by a position of a block of pixels of a predetermined size on the data track such that data values that are sequential in an ordinal arrangement are located in neighboring positions along the data track. At least one set of reconstructed correlation peaks are detected at the correlation plane matching the modulation pattern of the second beam of light. A brightness of the set of detected reconstructed correlation peaks indicates a similarity between the image to-be-correlated and an image stored in the optical storage medium. Accordingly, the block of pixels can be shifted in the image to-be-correlated for creating a detectable shift of at least one correlation peak at the correlation plane. Similarly, the block of pixels can be duplicated in the image to-be-correlated for creating a detectable shift of at least one correlation peak at the correlation plane.

BRIEF DESCRIPTION OF THE DRAWING

The present invention is illustrated by way of example and is not limited by the accompanying figures in which like reference numerals indicate similar elements and in which.

DETAILED DESCRIPTION

Figure 1:
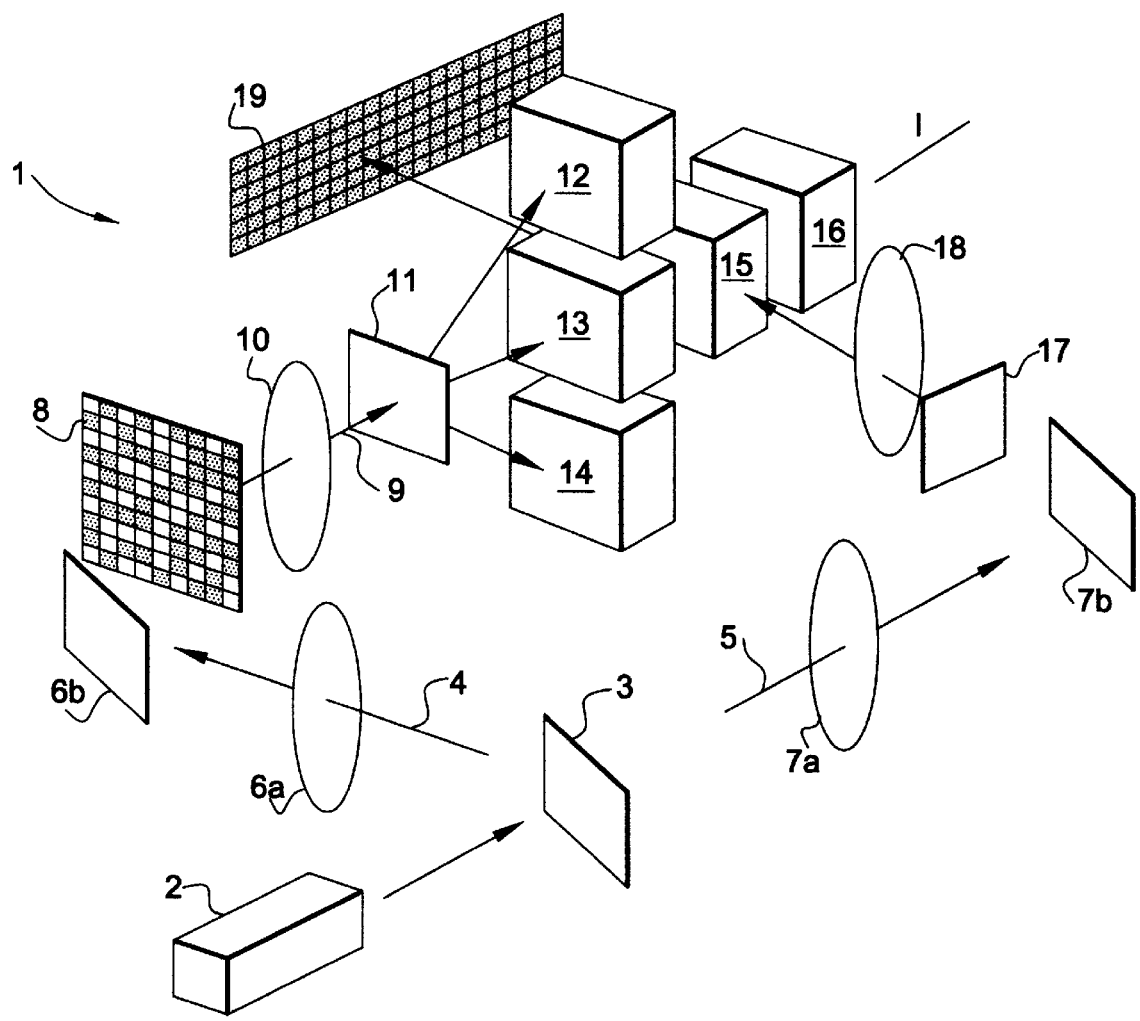
FIG. 1 shows a preferred arrangement of a high-capacity holographic content-addressable data storage system according to the present invention.

The present invention provides a content-addressable optical data storage system in which the number of holograms that are simultaneously illuminated is significantly increased over conventional content-addressable optical data storage systems. The present invention also provides several techniques for improving data discrimination and signal-to-noise ratio for optical correlation for a content-addressable optical data storage system. Further, the present invention provides a technique for similarity searching a content-addressable optical data storage system.

According to one aspect of the present invention, two distinct storage system architectures are provided for increasing the number of hologram storage volumes, or blocks of storage material, containing multiplexed holograms that are simultaneously illuminated by a querying object beam. The number of holograms that are multiplexed at any one location in the storage material is not increased based on the limited dynamic range of each hologram. That is, the diffraction efficiency of each hologram scales as the reciprocal of the number of superimposed holograms squared.

The first architecture provided by the present invention increases the number of hologram storage volumes along the object beam path. Hologram storage volumes are organized to be one behind another along the path of the object beam so that the significant portion of the object beam that passes through a hologram storage volume without diffraction becomes an input object beam for the subsequent hologram storage volume. Preferably, a single long rod of storage material (several centimeters long) is used and that has side faces that are capable of total internal reflection so that the object beam is kept confined. Additionally, the storage material must preferably have a low absorption, that is, highly transmissive, and is highly sensitivity at the wavelength of light used for reading and for querying the database, such as a permanent storage material that bleached during recording, or two-color gated recording in photorefractives. Alternatively, a plurality of separate blocks of storage material for each hologram storage volume can be used. With the latter approach, lenses may be required for keeping the information-bearing object beam confined to a small cross-section.

The second architecture provided by the present invention splits the object beam into a number of paths by illuminating a spatial light modulator (SLM) with a plurality of incident beams, or by passing an object beam through a diffractive optical element before and after a spatial light modulator. The laser power is split and used only once for each block of storage material so there is a corresponding decrease in power associated with each object beam path at the correlation plane during recording. One solution for addressing the corresponding decrease in power is by configuring the optical data storage system so that all the optical power is concentrated in one path during a recording operation, but split uniformly among all paths during a readout operation.

By providing simultaneously illuminated a plurality of holograms, the present invention can be used for general optical correlation tasks, including multi-channel recognition of analog images because the ability to have a large number of templates provides the possibility for feature identification, rotational and scale invariance, and multiple target classes. Further, an optical data storage system according to the present invention need not be entirely stationary. Multiple illuminated storage locations can be distributed throughout a selected region of a rotating disk, for example, so that a laser pulse accesses more than one location at a time. As the disk rotates, subsequent laser pulses access different set of locations at correspondingly different selected region of the disk.

FIG. 1 shows a preferred arrangement of a high-capacity holographic content-addressable data storage system 1 according to the present invention. Coherent light from a laser 2, such as a diode laser, is split by a beamsplitter 3 into two beams 4 and 5 that respectively become an object beam and a reference beam. Beams 4 and 5 are then respectively collimated and routed by optics 6a, 7a and mirrors 6b, 7b.

Beam 4 is routed through a spatial light modulator (SLM) 8, which is a two-dimensional array of pixels capable of blocking or passing light. Preferably, SLM 8 is a reflection-type or a transmission type liquid-crystal device (LCD). Alternatively, SLM 8 can be a micromechanical reflection modulator. SLM 8 includes a plurality of individual elements that each have a first state that allows coherent light pass through SLM 8, and a second state in which a minimum amount of coherent light passes through SLM 8. The data that is to-be-stored is arranged into patterns on SLM 8 so that beam 4 passes through SLM 8 and becomes an object beam 9. Alternatively, SLM 8 and generation of the coherent light beams can be within the same device.

Object beam 9 is focussed by a lens 10 through a beam-splitting element 11 into hologram storage volumes 12, 13 and 14, each formed from an optical storage material, such as a photorefractive crystal, a photopolymer or a spectral hole burning (SHB) material, so that identical copies of the data imaged from SLM 8 are conveyed to different locations in storage material 12, 13 and 14. When a photorefractive crystal is used, the crystal is made photosensitive to recording light by pre-exposing or simultaneously exposing the crystal in a well-known manner with gating light having a different wavelength or polarization than that of the recording light. Object beam 9 passes through the different locations in storage material 13 to additional locations (15, 16) located behind ("downstream") storage material 13.

Reference beam 5 passes through a beam-steering element 17 and lens(es) 18 that direct reference beam 5 to one (or more) of the storage locations in storage materials 12–16. In the preferred embodiment of the present invention, reference beam 5 enters the hologram storage volumes 13, 15 and 16 perpendicularly to a longitudinal axis 1 through hologram storage volumes 13, 15 and 16. Lens(es) 18 focus reference beam 5 onto a correlation-plane detector array (CDA) 19. Lens(es) 18 can be located along the reference beam path either before or after the optical storage material. Once the interference fringes formed by the two coherent beams are preserved in the photosensitive material, the reference beam 5 is blocked and a set of search data is arrayed onto SLM 8. The beam modulated by the search data information is simultaneously projected into all of hologram storage volumes 12–16 for reconstructing a set of output reference beams. Preferably, the optics used to store reference beam 5 allow the reconstructed beams to come to focus on correlation detector array (CDA) 19 without any intervening optics.

The present invention provides several techniques for providing improved discrimination and signal-to-noise ratio for optical correlation for a content addressable optical data storage system, such as using a modified reference beam, by a selected organization of data patterns during storage and during database interrogation, by using shift invariance, and by conditioning received signals.

Figure 2:
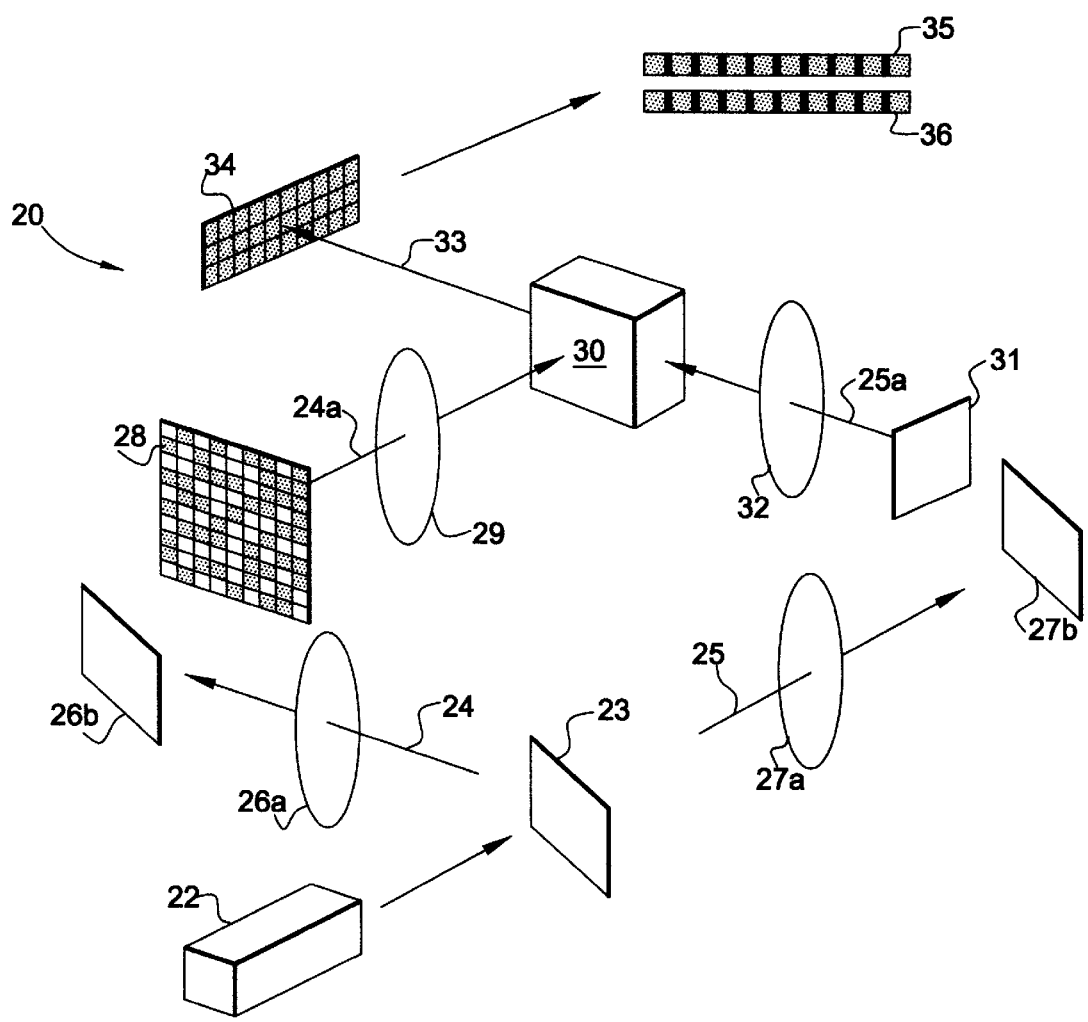
FIG. 2 shows an arrangement of a holographic content-addressable data storage system having improved discrimination and signal-to-noise ratio for optical correlation according to the present invention.

FIG. 2 shows an arrangement of a holographic content-addressable data storage system 20 according to the present invention having improved discrimination and signal-to-noise ratio for optical correlations. Coherent light from a laser 22, such as a diode laser, is split by a beamsplitter 23 into two beams 24 and 25 that respectively become an object beam and a reference beam. Beams 24 and 25 are then respectively collimated and routed by optics 26a, 27a and mirrors 26b, 27b.

Beam 24 is routed through a Spatial Light Modulator (SLM) 28, which is a two-dimensional array of pixels capable of blocking or passing light, and modulating the phase of the light passing through each pixel. Preferably, SLM 28 is a reflection-type or a transmission type LCD device. Alternatively, SLM 28 can be a micromechanical reflection modulator. The data that is to-be-stored is arranged into patterns on SLM 28 so that beam 24 passes through SLM 28 and becomes an object beam 24a. Object beam 24a is then focussed by a lens 29 into a hologram storage volume 30 formed from an optical storage material, such as a photopolymer, a photorefractive crystal or a spectral hole burning (SHB) material.

Reference beam 25 passes through a diffractive optical element 31 that modulates beam 25 forming a reference beam 25a that has a uniquely-modified spatial frequency spectrum with respect to other reference beams used for recording images in the optical storage material. Modulated reference beam 25a is directed by beam-steering optics 32 into optical storage material 30 to form an interference pattern with object beam 24a that is recorded in hologram storage volume 30.

Preferably, diffractive optical element 31 is a low-frequency grating, such as a phase grating, 1-D Dammann grating, or other similar diffractive optical element, that changes the Fourier spectrum of beam 25a from one focussed spot at a correlation plane to a plurality of vertically-spaced focussed spots at the correlation plane that can be uniquely identified in the presence of noise. Preferably, modified reference beam 25a is formed from several plane waves that differ slightly in vertical incidence angle. Additionally, the reference beam path contains a lens (not shown) positioned either before or after hologram storage volume 30 so that a large plane-wave reference beam is focussed to a localized region of a correlation detector array 34. Correlation detector array 34 generates a correlation signal that is based on a summation over several slightly separated pixel regions minus the optical signal falling on the pixels in between the regions. In an idealized system, the correlation peak(s) that appear at the correlation plane for an exact match between the stored and query images is (are) then simply the Fourier transform of the reference beam.

Shift invariance makes it possible for one of the correlation peaks of a hologram to potentially adversely shift into a region of the correlation plane that is associated with another hologram. Consequently, erroneous matches can occur unless the two correlation peaks are distinct. To avoid this, the present invention imparts different spatial frequency modulations to the reference beams used for storing different holograms that have correlation peaks that are displaced vertically by diffractive optical element 31 so that a true match to a query image can be distinguished from a shifted match of another hologram.

Once the interference fringes formed by the two coherent beams 24a and 25a are preserved in the photosensitive material of hologram storage volume 30, reference beam 25 is blocked and a set of search data is arrayed onto SLM 28. The beam modulated by the search data arrayed on SLM 28 is projected into hologram storage volume 30 and reconstructs a set of output reference beams 33. Preferably, optics 32 used to store the reference beam allows reconstructed beams 33 to be focussed on correlation detector array 34 without any intervening optics.

After holograms are stored, but before searching, storage system 20 is calibrated for reducing the effects of variations in diffraction efficiency from hologram to hologram and for reducing "dark" signal level effects. Hologram-to-hologram variations in diffraction efficiency become a noise source because the correlation peaks for many holograms are thresholded together. The dark signal level adversely affects optical correlation by consuming part of the dynamic range of the correlation detector. Additionally, variations of the dark signal level caused by the number and position of ON pixels in each hologram adversely affect optical correlation.

According to the invention, a bias signal and a background signal are measured for each bin of correlation detector array 34. Thus, a signal received by correlation detector array 34 can be conditioned by biasing based on hologram strength and/or by subtracting a dark signal level from the received signal. The bias values for each bin of correlation detector array 34 are measured by interrogating stored holograms with a special interrogating pattern that is preferably a small gauging block that all the stored holograms share in common, and is preferably an all-ON page pattern. The measured bias level data for each correlation bin is stored in electronic form in a shift register, or an array 35 and used during normal detection. The effect of the variations are reduced by scaling the received signal values by the individual bias level data for each hologram.

As with the bias level data, the dark signal level is also measured by the present invention on a hologram-by-hologram basis by illuminating each stored hologram with a special interrogating pattern that is preferably an all-OFF pattern. The measured dark signal level data for each correlation bin is stored in electronic form in a shift register or an array 36, and used during normal detection as background level data.

Figure 3:
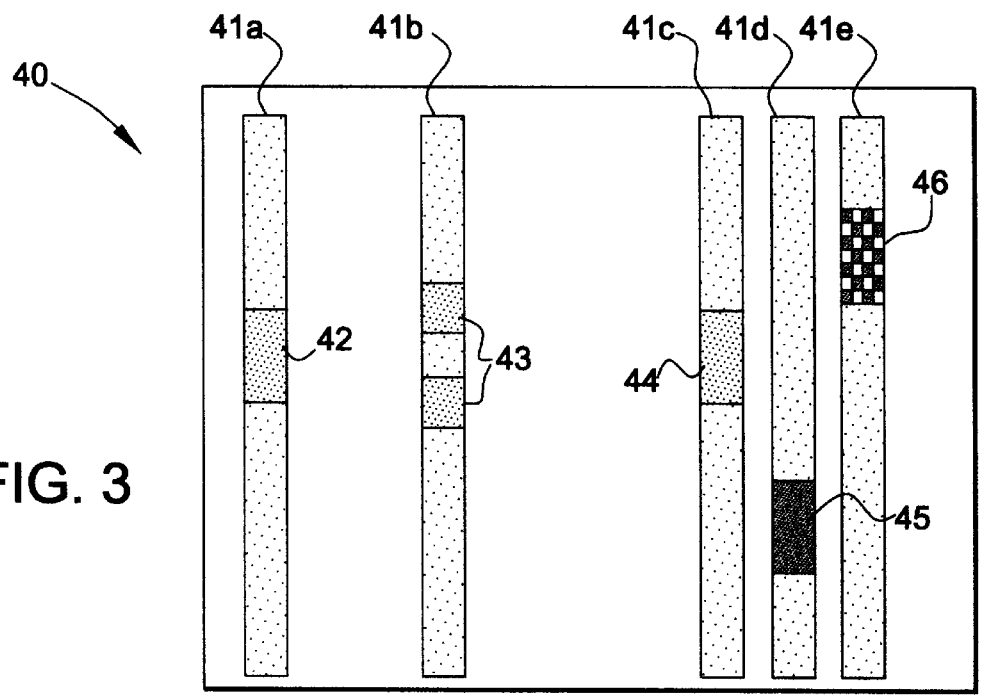
FIG. 3 shows an arrangement of exemplary spatial patterns displayed on a spatial light modulator.

Yet another technique provided by the present invention for providing improved discrimination and signal-to-noise ratio for optical correlation is by using a selected organization of data patterns during storage and during database interrogation, such as a slider bar, pixel grey-level weighting, and pixel phase modulation. FIG. 3 shows an arrangement 40 of exemplary spatial patterns displayed on a spatial light modulator. An image displayed on the spatial light modulator is arranged into regions 41a–41e that correspond to the fixed-length fields of the database that is stored optical storage system 20. The position of a block of ON pixels 42 within a region, such as region 41a, encodes a desired data value.

A slider bar, or track, is a pixellated pattern of data that is displayed by a spatial light modulator along an organized path according to a desired ordinality of the data that can be used during recording and during a similarity search. A preferred ordinality of data is a vertical column or track of pixels in which the position of the block of pixels that are turned ON within the column indicates the data value being stored or being searched for. According to the invention, the column of pixels is not necessarily vertical, but should be orthogonal to the interaction plane formed by the central reference and object beams.

The choice of the size or height of the slider within a track, both during storage and during interrogation, is a tradeoff between a search range (degree of similarity) and a signal strength of a resulting correlation peak. For example, consider a record containing the value "83%" encoded by a rectangular block having a height of 10 pixels within a slider track of 100 pixels so that the "83%" record is a rectangular block extending from pixel 78 to 88 of the slider track. When searching for records exactly matching the encoded value of "83%", an interrogating spatial pattern having a small block of 10 pixels centered at pixel 83 of the slider track generates a strong correlation response from the record encoding "83%". Another record encoding the value "79%", however, also generates a correlation response, albeit a slightly smaller, because the overlap between the record encoding "79%" (pixels 74 to 84) and the search block (pixels 78 to 88) is only 6 pixels, as opposed to the overlap of 10 pixels for a record encoding "83%". An exact search for a record encoding the value "83%" would discard a record encoding a value of "79%" as well as a record encoding the value of, for example, "22%" as equally undesirable.

Thus, the slider bars of the present invention enable fuzzy, or similarity, searching. That is, records that partially match an interrogating spatial pattern generate a correlation response that is scaled by the degree to which records match the interrogating spatial pattern. An extremely broad, or fuzzy, search can be performed using the sliders of the present invention by increasing the height of the search bar to generate correlation responses, for example, for any record encoding a value in the range of "60%" to "100%". Accordingly, dynamic adjustment of a search range can be achieved without erasing and re-recording holograms. During readout, blocks may be shifted slightly, as shown at 43 in FIG. 4, so that vertical shift invariance creates a unique pattern of readout correlation peaks that can be detected in the presence of noise or background signal.

When simultaneously searching several fields, such as fields 41c–41e, responses may be weighted relative to each other by a change in transmission, or gray level, in the pixels of the spatial light modulator, as shown at 44 and 45 in FIG. 3, or by selective reduction in the number of ON pixels within a desired block, referred to herein as dithering, as shown at 46. The various data patterns displayed during interrogation (or during storage) can be weighted in terms of relative importance by using a gray-level response in the pixels of the spatial light modulator. Pixel brightnesses in a stored image can also be decreased by reducing a temporal exposure during recording.

Figure 4:
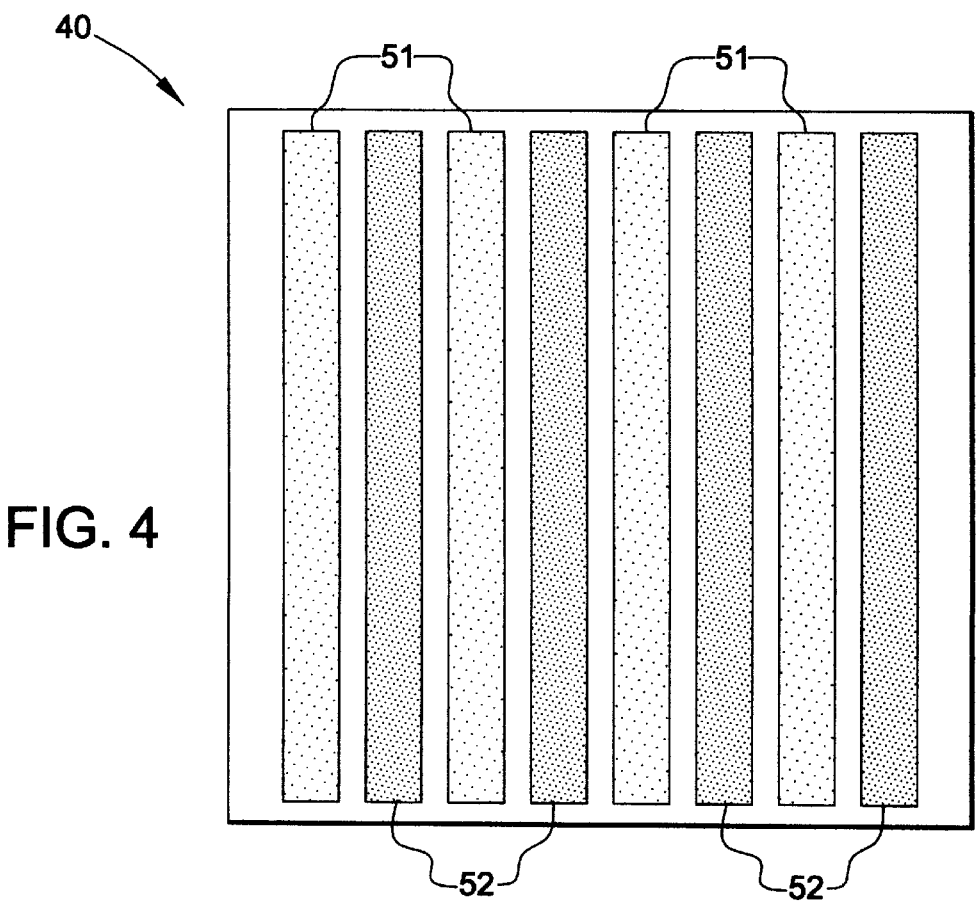
FIG. 4 shows an exemplary periodic arrangement of phase for a spatial pattern displayed on a spatial light modulator.

Phase modulation of the reference beam by displaying multiple phase levels on the spatial light modulator can be used for suppressing a cross-correlation and for reduction of dark current. The control over the phase of each pixel requires slight modification of the polarization input to the spatial light modulator in a well-known manner, and placement of the output polarizer at a tilted angle, also in a well-known manner. FIG. 4 shows an exemplary periodic arrangement 50 of phase for a spatial pattern displayed on a spatial light modulator. The phase of the pixels used within each region can be varied across the page of the spatial light modulator. In this way, the undesired background signal arising from not-completely-OFF pixels of a finite contrast spatial light modulator is reduced by destructive interference. Preferably, ON pixels within a subset of the regions 51 within the page always take the value +1 (0 phase), while the ON pixels within all other regions 52 always take the value −1 ($\pi$ phase).

Imperfect contrast in the spatial light modulator causes a small amount of light to be input into the storage medium from pixels that are nominally OFF, both as an interrogating spatial pattern or as a stored data pattern. Consequently, in addition to the desired signal, there will be undesired background signal caused by ON-OFF and OFF-OFF combinations of the pixels of the interrogating search pattern and the stored data pages. The desired signal is generated by, for example, ON pixels in an interrogating spatial pattern matching ON pixels in stored data pages. The undesired background signal is generated by, for example, an ON pixel in an interrogating search pattern correlating with a weak hologram of an OFF pixel in a stored page (or vice versa, an OFF pixel in an interrogating search pattern reading a strong hologram from an ON pixel in a stored page), or an OFF-OFF pixel combination. Each undesired contribution diffracts only a small amount of light towards the correlation plane, but the sum effect over thousands of pixels creates a sizable "dark" signal that is effectively a deterministic noise source.

According to the invention, the dark signal noise source can be reduced by phase modulating the spatial light modulator during data storage so that each field or slider track has an associated constant phase value. The phase value is alternated across the display so that the DC level of the dark signal is zero. For example, odd columns of the spatial light modulator are selected to always have negative phase, while even columns are selected to always have a positive phase. Interrogating signals add up as desired (a negative input reads out a negative block, positive input reads a positive block), but the undesired ON-OFF dark signal is suppressed. To suppress the dark signal caused by OFF-OFF pixel combinations, the phase of the OFF pixels can also be spatially modulated, either during storage or searching, but not both, so that the contribution to the dark signal by OFF-OFF pixel combinations tends to cancel by destructive interference.

For exact searches on data fields that are composed of multiple blocks, such as a byte of data composed of 8 blocks with each block representing a bit, the ratio between autocorrelation and undesired cross-correlations, for example, when 7 bits match, but 1 bit differs, can be increased by using both positive and negative phase values within the blocks.

By interrogating stored patterns with a slightly shifted version, a correlation peak can be moved to be within a correlation plane. That is, by illuminating a stored pattern with a closely related, but not identical interrogating pattern, the shift invariance can be exploited to create a unique distribution of correlation peaks at a location near the auto-correlation peak. Preferably, a block located within a slider track is identified by interrogating with two blocks: one above and one below the first block within the slider track. Matches are identified by two slightly-spaced peaks straddling the nominal correlation peak position within the correlation plane.

Implementation of the shift invariance is based on the organization of search data so that a set of closely-spaced multiple correlation peaks are generated at the correlation plane. A similar modified metric can be used for generating an appropriate correlation score, to which several regions of the correlation plane affirmatively contribute. Any detected light in the regions in between the regions can be used for reducing the correlation score.

While the present invention has been described in connection with the illustrated embodiments, it will be appreciated and understood that modifications may be made without departing from the true spirit and scope of the invention.

What is claimed is:

1. A method for recording information in a content-addressable optical storage system, the method comprising the steps of:

modulating a first beam of light with information of an image to-be-stored, the image to-be-stored having a plurality of pixels representing at least one field of digital data selectively organized along a selected data track as a pattern of ON and OFF pixels representing a data value by a position of a block of pixels of a predetermined size on the data track such that data values that are sequential in an ordinal arrangement are located in neighboring positions along the data track;

directing the first beam of light to a storage location in an optical storage medium;

directing a second beam of light to the storage location in the optical storage medium, the second beam of light being coherent with the first beam of light;

passing the second beam of light through the optical storage medium;

focussing the second beam of light after passing through the optical storage medium at at least a localized portion of a correlation plane; and recording the image to-be-stored in the storage medium at the storage location in the optical storage medium based on an intersection of the first beam and the second beam in the optical storage medium.

2. The method according to claim 1, wherein the pattern of ON and OFF pixels are weighted by one of an amplitude and a phase based on a contribution of the field to a correlation result.

3. The method according to claim 1, wherein the step of modulating the first beam of light is performed by a spatial light modulator having a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired diffraction caused by non-zero OFF-state modulating elements of the spatial light modulator.

4. The method according to claim 1, wherein the step of modulating the first beam of light is performed by a spatial light modulator having a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired cross-correlation between an exact match and a nearly exact match of the image to-be-correlated.

5. The method according to claim 1, wherein the image to-be-stored is a test image pattern, the method further comprising the steps of:

detecting a set of bias values from detected correlation peaks; and scaling subsequently-detected correlation peaks relative to each other based on the set of bias values.

6. The method according to claim 5, wherein all pixels of the test image pattern block light, and wherein the set of bias values are used for compensating subsequently-detected correlation peaks.

7. The method according to claim 6, wherein the set of bias values are subtracted from subsequently-detected correlation peaks.

8. The method according to claim 1, further comprising the steps of:

blocking the second beam of light from being directed to the optical storage medium;

modulating a third beam of light with information of an image to-be-correlated, the image to-be-correlated having a plurality of pixels representing at least one field selectively organized along a selected data track as a pattern of ON and OFF pixels representing a data value by a position of a block of pixels of a predetermined size on the data track such that data values that are sequential in an ordinal arrangement are located in neighboring positions along the data track;

directing the third beam of light to the optical storage medium; and detecting at least one reconstructed correlation peak at the correlation plane, a brightness of a detected reconstructed correlation peak indicating a similarity between the image to-be-correlated and an image stored in the optical storage medium.

9. The method according to claim 8, wherein the block of pixels is shifted in the image to-be-correlated for creating a detectable shift of at least one correlation peak at the correlation plane.

10. The method according to claim 9, wherein the block of pixels is duplicated in the image to-be-correlated for creating a detectable shift of at least one correlation peak at the correlation plane.

11. A method for correlating information in a content-addressable optical storage system, the method comprising the steps of:

modulating a first beam of light with information of an image to-be-correlated, the image to-be-correlated having a plurality of pixels representing at least one field selectively organized along a selected data track as a pattern of ON and OFF pixels representing a data value by a position of a block of pixels of a predetermined size on the data track such that data values that are sequential in an ordinal arrangement are located in neighboring positions along the data track;

directing the first beam of light to an optical storage medium; and detecting at least one reconstructed correlation peak at the correlation plane, a brightness of a detected reconstructed correlation peak indicating a similarity between the image to-be-correlated and an image stored in the optical storage medium.

12. The method according to claim 11, wherein the block of pixels is shifted in the image to-be-correlated for creating a detectable shift of at least one correlation peak at the correlation plane.

13. The method according to claim 12, wherein the block of pixels is duplicated in the image to-be-correlated for creating a detectable shift of at least one correlation peak at the correlation plane.

14. A method for recording information in a content-addressable optical storage system, the method comprising the steps of:

modulating a first beam of light with information of an image to-be-stored, the image to-be-stored having a plurality of pixels representing at least one field of digital data organized as a pattern of ON and OFF pixels;

directing the first beam of light to a storage location in an optical storage medium;

modulating a second beam of light with a predetermined modulation pattern, the second beam of light being coherent with the first beam of light;

directing the second beam of light to the storage location in the optical storage medium;

passing the second beam of light through the optical storage medium;

focussing the second beam of light at a plurality of localized portions of a correlation plane in the predetermined modulation pattern after the second beam of light passes through the optical storage medium; and recording the image to-be-stored in the storage medium at the storage location in the optical storage medium based on an intersection of the first beam and the second beam in the optical storage medium.

15. The method according to claim 14, wherein the pattern of ON and OFF pixels are weighted by one of an amplitude and a phase based on a contribution of the data field to a correlation result.

16. The method according to claim 14, wherein the step of modulating the first beam of light is performed by a spatial light modulator having a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired diffraction caused by non-zero OFF-state modulating elements of the spatial light modulator.

17. The method according to claim 14, wherein the step of modulating the first beam of light is performed by a spatial light modulator having a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired cross-correlation between an exact match and a nearly exact match of the image to-be-correlated.

18. The method according to claim 14, wherein the image to-be-stored is a test image pattern, the method further comprising the steps of:

detecting a set of bias values from detected correlation peaks; and scaling subsequently-detected correlation peaks relative to each other based on the set of bias values.

19. The method according to claim 18, wherein all pixels of the test image pattern block light, and wherein the set of bias values are used for compensating subsequently-detected correlation peaks.

20. The method according to claim 19, wherein the set of bias values are subtracted from subsequently-detected correlation peaks.

21. The method according to claim 14, further comprising the steps of:

blocking the second beam of light from being directed to the optical storage medium;

modulating a third beam of light with information of an image to-be-correlated, the image to-be-correlated having a plurality of pixels representing at least one field organized as a pattern of ON and OFF pixels;

directing the third beam of light to the optical storage medium; and detecting at least one set of reconstructed correlation peaks at the correlation plane matching the modulation pattern of the second beam of light, a brightness of the set of detected reconstructed correlation peaks indicating a similarity between the image to-be-correlated and an image stored in the optical storage medium.

22. The method according to claim 21, wherein the block of pixels is shifted in the image to-be-correlated for creating a detectable shift of at least one correlation peak at the correlation plane.

23. The method according to claim 22, wherein the block of pixels is duplicated in the image to-be-correlated for creating a detectable shift of at least one correlation peak at the correlation plane.

24. A method for correlating information in a content-addressable optical storage system, the method comprising the steps of:

modulating a first beam of light with information of an image to-be-correlated, the image to-be-correlated having a plurality of pixels representing at least one field organized as a pattern of ON and OFF pixels;

directing the first beam of light to an optical storage medium; and detecting at least one set of reconstructed correlation peaks at the correlation plane matching a modulation pattern of a second beam of light used for recording an image in the optical storage medium, a brightness of the set of detected reconstructed correlation peaks indicating a similarity between the image to-be-correlated and the image stored in the optical storage medium.

25. The method according to claim 24, wherein the block of pixels is shifted in the image to-be-correlated for creating a detectable shift of at least one correlation peak at the correlation plane.

26. The method according to claim 25, wherein the block of pixels is duplicated in the image to-be-correlated for creating a detectable shift of at least one correlation peak at the correlation plane.

27. A method for recording information in a content-addressable optical storage system, the method comprising the steps of:

modulating a first beam of light with information of an image to-be-stored, the image to-be-stored having a plurality of pixels representing at least one field of digital data selectively organized along a selected data track as a pattern of ON and OFF pixels representing a data value by a position of a block of pixels of a predetermined size on the data track such that data values that are sequential in an ordinal arrangement are located in neighboring positions along the data track;

directing the first beam of light to a storage location in an optical storage medium;

modulating a second beam of light with a predetermined modulation pattern, the second beam of light being coherent with the first beam of light;

directing the second beam of light to the storage location in the optical storage medium;

passing the second beam of light through the optical storage medium;

focussing the second beam of light at a plurality of localized portions of a correlation plane in the predetermined modulation pattern after the second beam of light passes through the optical storage medium; and recording the image to-be-stored in the storage medium at the storage location in the optical storage medium based on an intersection of the first beam and the second beam in the optical storage medium.

28. The method according to claim 27, wherein the pattern of ON and OFF pixels are weighted by one of an amplitude and a phase based on a contribution of the data field to a correlation result.

29. The method according to claim 27, wherein the step of modulating the first beam of light is performed by a spatial light modulator having a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired diffraction caused by non-zero OFF-state modulating elements of the spatial light modulator.

30. The method according to claim 27, wherein the step of modulating the first beam of light is performed by a spatial light modulator having a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired cross-correlation between an exact match and a nearly exact match of the image to-be-correlated.

31. The method according to claim 27, wherein the image to-be-stored is a test image pattern, the method further comprising the steps of:

detecting a set of bias values from detected correlation peaks; and scaling subsequently-detected correlation peaks relative to each other based on the set of bias values.

32. The method according to claim 31, wherein all pixels of the test image pattern block light, and wherein the set of bias values are used for compensating subsequently-detected correlation peaks.

33. The method according to claim 32, wherein the set of bias values are subtracted from subsequently-detected correlation peaks.

34. The method according to claim 27, further comprising the steps of:

blocking the second beam of light from being directed to the optical storage medium;

modulating a third beam of light with information of an image to-be-correlated, the image to-be-correlated having a plurality of pixels representing at least one field selectively organized along a selected data track as a pattern of ON and OFF pixels representing a data value by a position of a block of pixels of a predetermined size on the data track such that data values that are sequential in an ordinal arrangement are located in neighboring positions along the data track;

directing the third beam of light to the optical storage medium; and detecting at least one set of reconstructed correlation peaks at the correlation plane matching the modulation pattern of the second beam of light, a brightness of the set of detected reconstructed correlation peaks indicating a similarity between the image to-be-correlated and an image stored in the optical storage medium.

35. The method according to claim 34, wherein the block of pixels is shifted in the image to-be-correlated for creating a detectable shift of at least one correlation peak at the correlation plane.

36. The method according to claim 35, wherein the block of pixels is duplicated in the image to-be-correlated for creating a detectable shift of at least one correlation peak at the correlation plane.

37. A method for correlating information in a content-addressable optical storage system, the method comprising the steps of:

modulating a first beam of light with information of an image to-be-correlated, the image to-be-correlated having a plurality of pixels representing at least one field selectively organized along a selected data track as a pattern of ON and OFF pixels representing a data value by a position of a block of pixels of a predetermined size on the data track such that data values that are sequential in an ordinal arrangement are located in neighboring positions along the data track;

directing the first beam of light to an optical storage medium; and detecting at least one set of reconstructed correlation peaks at the correlation plane matching a modulation pattern of a second beam of light used for recording an image in the optical storage medium, a brightness of the set of detected reconstructed correlation peaks indicating a similarity between the image to-be-correlated and the image stored in the optical storage medium.

38. The method according to claim 37, wherein the block of pixels is shifted in the image to-be-correlated for creating a detectable shift of at least one correlation peak at the correlation plane.

39. The method according to claim 38, wherein the block of pixels is duplicated in the image to-be-correlated for creating a detectable shift of at least one correlation peak at the correlation plane.

40. An optical storage system, comprising:

a light generator generating a coherent light beam;

a beam splitter splitting the coherent light beam into first and second beams of light;

a spatial light modulator modulating the first beam of light with information of an image to-be-stored, the image to-be-stored having a plurality of pixels representing at least one field of digital data selectively organized along a selected data track as a pattern of ON and OFF pixels representing a data value by a position of a block of pixels of a predetermined size on the data track such that data values that are sequential in an ordinal arrangement are located in neighboring positions along the data track;

an optical storage medium receiving the first and second beams of light, the first beam of light being directed to a storage location in the optical storage medium, the second beam of light being directed to the storage location in the optical storage medium and passing through the optical storage medium, the image to-be-stored being recorded in the storage medium at a location of storage location based on an intersection of the first beam and the second beam in the optical storage medium; and a correlation-plane detector on which the second beam of light is focussed at at least a localized portion of a correlation plane after passing through the optical storage medium.

41. The optical storage system according to claim 40, wherein the pattern of ON and OFF pixels are weighted by one of an amplitude and a phase based on a contribution of the data field to a correlation result.

42. The optical storage system according to claim 40, wherein the spatial light modulator has a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired diffraction caused by non-zero OFF-state modulating elements of the spatial light modulator.

43. The optical storage system according to claim 40, wherein the spatial light modulator has a plurality of individual modulating elements, the modulating elements of the spatial light modulator being associated into at least two portions of the spatial light modulator, and wherein a different phase multiplier is modulated onto the portion of the first light beam incident upon elements in each respective portion of the spatial light modulator for minimizing an undesired cross-correlation between an exact match and a nearly exact match of the image to-be-correlated.

44. The optical storage system according to claim 40, wherein the image to-be-stored is a test image pattern, wherein the correlation-plane detector detects a set of bias values from detected correlation peaks that are used for scaling subsequently-detected correlation peaks relative.

45. The optical storage system according to claim 44, wherein all pixels of the test image pattern block light, and wherein the set of bias values are used for compensating subsequently-detected correlation peaks.

46. The optical storage system according to claim 45, wherein the set of bias values are subtracted from subsequently-detected correlation peaks.

47. The optical storage system according to claim 40, wherein the second beam of light is blocked from being directed to the plurality of storage locations in the optical storage medium, wherein the spatial light modulator modulates a third beam of light with information of an image to-be-correlated, the image to-be-correlated having a plurality of pixels representing at least one field selectively organized along a selected data track as a pattern of ON and OFF pixels representing a data value by a position of a block of pixels of a predetermined size on the data track such that data values that are sequential in an ordinal arrangement are located in neighboring positions along the data track and the third beam of light being directed to the plurality of storage locations in the optical storage medium, and wherein the correlation-plane detector detects at least one reconstructed correlation peak at the correlation plane.

48. The optical storage system according to claim 47, wherein the block of pixels is shifted in the image to-be-correlated for creating a detectable shift of at least one correlation peak at the correlation plane.

49. The optical storage system according to claim 48, wherein the block of pixels is duplicated in the image to-be-correlated for creating a detectable shift of at least one correlation peak at the correlation plane.

50. An optical storage system, comprising:

a spatial light modulator modulating a first beam of light with information of an image to-be-correlated, the image to-be-correlated having a plurality of pixels representing at least one field selectively organized along a selected data track as a pattern of ON and OFF pixels representing a data value by a position of a block of pixels of a predetermined size on the data track such that data values that are sequential in an ordinal arrangement are located in neighboring positions along the data track;

an optical storage medium receiving the first beam of light, the first beam of light being directed to a storage location in the optical storage medium,; and a correlation-plane detector detecting at least one reconstructed correlation peak at the correlation plane, a brightness of a detected reconstructed correlation peak indicating a similarity between the image to-be-correlated and an image stored in the optical storage medium.

51. The optical storage system according to claim 50, wherein the block of pixels is shifted in the image to-be-correlated for creating a detectable shift of at least one correlation peak at the correlation plane.

52. The optical storage system according to claim 51, wherein the block of pixels is duplicated in the image to-be-correlated for creating a detectable shift of at least one correlation peak at the correlation plane.

53. An optical storage system, comprising:

a light generator generating a coherent light beam;

a beam splitter splitting the coherent light beam into first and second beams of light;

a first spatial light modulator modulating the first beam of light with information of an image to-be-stored, the image to-be-stored having a plurality of pixels representing at least one field of digital data organized as a pattern of ON and OFF pixels;

a second spatial light modulator modulating a second beam of light with a predetermined modulation pattern;

an optical storage medium receiving the first and second beams of light, the first beam of light being directed to a storage location in the optical storage medium, the second beam of light being directed to the storage location in the optical storage medium and passing through the optical storage medium, the image to-be-stored being recorded in the storage medium at a location of storage location based on an intersection of the first beam and the second beam in the optical storage medium; and a correlation-plane detector on which the second beam of light is focussed at at least a plurality of localized portions of a correlation plane in the predetermined modulation pattern after passing through the optical storage medium.

54. The optical storage system according to claim 53, wherein the pattern of ON and OFF pixels are weighted by one of an amplitude and a phase based on a contribution of the data field to a correlation result.

55. The optical storage system according to claim 53, wherein the first spatial light modulator has a plurality of individual modulating elements, the modulating elements of the first spatial light modulator being associated into at least two portions of the first spatial light modulator, and wherein a different phase multiplier is modulated onto the portion of the first light beam incident upon elements in each respective portion of the first spatial light modulator for minimizing an undesired diffraction caused by non-zero OFF-state modulating elements of the first spatial light modulator.

56. The optical storage system according to claim 53, wherein the first spatial light modulator has a plurality of individual modulating elements, the modulating elements of the first spatial light modulator being associated into at least two portions of the first spatial light modulator, and wherein a different phase multiplier is modulated onto the portion of the first light beam incident upon elements in each respective portion of the first spatial light modulator for minimizing an undesired cross-correlation between an exact match and a nearly exact match of the image to-be-correlated.

57. The optical storage system according to claim 53, wherein the image to-be-stored is a test image pattern, wherein the correlation-plane detector detects a set of bias values from detected correlation peaks that are used for scaling subsequently-detected correlation peaks relative.

58. The optical storage system according to claim 57, wherein all pixels of the test image pattern block light, and wherein the set of bias values are used for compensating subsequently-detected correlation peaks.

59. The optical storage system according to claim 58, wherein the set of bias values are subtracted from subsequently-detected correlation peaks.

60. The optical storage system according to claim 53, wherein the second beam of light is blocked from being directed to the plurality of storage locations in the optical storage medium, wherein the first spatial light modulator modulates a third beam of light with information of an image to-be-correlated, the image to-be-correlated having a plurality of pixels representing at least one field of digital data organized as a pattern of ON and OFF pixels, and wherein the correlation-plane detector detects at least one set of reconstructed correlation peaks at the correlation plane matching a modulation pattern of a second beam of light used for recording an image in the optical storage medium, a brightness of the set of detected reconstructed correlation peaks indicating a similarity between the image to-be-correlated and the image stored in the optical storage medium.

61. The optical storage system according to claim 60, wherein the block of pixels is shifted in the image to-be-correlated for creating a detectable shift of at least one correlation peak at the correlation plane.

62. The optical storage system according to claim 61, wherein the block of pixels is duplicated in the image to-be-correlated for creating a detectable shift of at least one correlation peak at the correlation plane.

63. An optical storage system, comprising:
a spatial light modulator modulating a first beam of light with information of an image to-be-correlated, the image to-be-correlated having a plurality of pixels representing at least one field of digital data organized as a pattern of ON and OFF pixels;
an optical storage medium receiving the first beam of light, the first beam of light being directed to a storage location in the optical storage medium,; and
a correlation-plane detector detecting at least one set of reconstructed correlation peaks at the correlation plane matching a modulation pattern of a second beam of light used for recording an image in the optical storage medium, a brightness of the set of detected reconstructed correlation peaks indicating a similarity between the image to-be-correlated and the image stored in the optical storage medium.

64. The optical storage system according to claim 63, wherein the block of pixels is shifted in the image to-be-correlated for creating a detectable shift of at least one correlation peak at the correlation plane.

65. The optical storage system according to claim 64, wherein the block of pixels is duplicated in the image to-be-correlated for creating a detectable shift of at least one correlation peak at the correlation plane.

66. An optical storage system, comprising:
a light generator generating a coherent light beam;
a beam splitter splitting the coherent light beam into first and second beams of light;
a first spatial light modulator modulating the first beam of light with information of an image to-be-stored, the image to-be-stored having a plurality of pixels representing at least one field of digital data selectively organized along a selected data track as a pattern of ON and OFF pixels representing a data value by a position of a block of pixels of a predetermined size on the data track such that data values that are sequential in an ordinal arrangement are located in neighboring positions along the data track;
a second spatial light modulator modulating a second beam of light with a predetermined modulation pattern;
an optical storage medium receiving the first and second beams of light, the first beam of light being directed to a storage location in the optical storage medium, the second beam of light being directed to the storage location in the optical storage medium and passing through the optical storage medium, the image to-be-stored being recorded in the storage medium at a location of storage location based on an intersection of the first beam and the second beam in the optical storage medium; and
a correlation-plane detector on which the second beam of light is focussed at at least a plurality of localized portions of a correlation plane in the predetermined modulation pattern after passing through the optical storage medium.

67. The optical storage system according to claim 66, wherein the pattern of ON and OFF pixels are weighted by one of an amplitude and a phase based on a contribution of the data field to a correlation result.

68. The optical storage system according to claim 66, wherein the first spatial light modulator has a plurality of individual modulating elements, the modulating elements of the first spatial light modulator being associated into at least two portions of the first spatial light modulator, and
wherein a different phase multiplier is modulated onto the portion of the first light beam incident upon elements in each respective portion of the first spatial light modulator for minimizing an undesired diffraction caused by non-zero OFF-state modulating elements of the first spatial light modulator.

69. The optical storage system according to claim 66, wherein the first spatial light modulator has a plurality of individual modulating elements, the modulating elements of the first spatial light modulator being associated into at least two portions of the first spatial light modulator, and
wherein a different phase multiplier is modulated onto the portion of the first light beam incident upon elements in each respective portion of the first spatial light modulator for minimizing an undesired cross-correlation between an exact match and a nearly exact match of the image to-be-correlated.

70. The optical storage system according to claim 66, wherein the image to-be-stored is a test image pattern,
wherein the correlation-plane detector detects a set of bias values from detected correlation peaks that are used for scaling subsequently-detected correlation peaks relative.

71. The optical storage system according to claim 70, wherein all pixels of the test image pattern block light, and
wherein the set of bias values are used for compensating subsequently-detected correlation peaks.

72. The optical storage system according to claim 71, wherein the set of bias values are subtracted from subsequently-detected correlation peaks.

73. The optical storage system according to claim 72, wherein the second beam of light is blocked from being directed to the plurality of storage locations in the optical storage medium,
wherein the first spatial light modulator modulates a third beam of light with information of an image to-be-correlated, the image to-be-correlated having a plurality of pixels representing at least one field of digital data organized as a pattern of ON and OFF pixels, and
wherein the correlation-plane detector detects at least one set of reconstructed correlation peaks at the correlation plane matching a modulation pattern of a second beam of light used for recording an image in the optical storage medium, a brightness of the set of detected reconstructed correlation peaks indicating a similarity between the image to-be-correlated and the image stored in the optical storage medium.

74. The optical storage system according to claim 73, wherein the block of pixels is shifted in the image to-be-correlated for creating a detectable shift of at least one correlation peak at the correlation plane.

75. The optical storage system according to claim 74, wherein the block of pixels is duplicated in the image to-be-correlated for creating a detectable shift of at least one correlation peak at the correlation plane.

76. An optical storage system, comprising:

a spatial light modulator modulating a first beam of light with information of an image to-be-stored, the image to-be-stored having a plurality of pixels representing at least one field of digital data selectively organized along a selected data track as a pattern of ON and OFF pixels representing a data value by a position of a block of pixels of a predetermined size on the data track such that data values that are sequential in an ordinal arrangement are located in neighboring positions along the data track;

an optical storage medium receiving the first beam of light, the first beam of light being directed to a storage location in the optical storage medium; and a correlation-plane detector detecting at least one set of reconstructed correlation peaks at the correlation plane matching a modulation pattern of a second beam of light used for recording an image in the optical storage medium, a brightness of the set of detected reconstructed correlation peaks indicating a similarity between the image to-be-correlated and the image stored in the optical storage medium.

77. The optical storage system according to claim 76, wherein the block of pixels is shifted in the image to-be-correlated for creating a detectable shift of at least one correlation peak at the correlation plane.

78. The optical storage system according to claim 77, wherein the block of pixels is duplicated in the image to-be-correlated for creating a detectable shift of at least one correlation peak at the correlation plane.

* * * * *

UNITED STATES PATENT AND TRADEMARK OFFICE
CERTIFICATE OF CORRECTION

PATENT NO. : 6,175,543 B1  Page 1 of 1
DATED : January 16, 2001
INVENTOR(S) : Geoffrey W. Burr et al.

It is certified that error appears in the above-identified patent and that said Letters Patent is hereby corrected as shown below:

<u>Title page,</u>

Title: "CANTENT" has been replaced with -- CONTENT --.

Signed and Sealed this

First Day of January, 2002

Attest:

Attesting Officer

JAMES E. ROGAN
*Director of the United States Patent and Trademark Office*